United States Patent [19]

Dumbri et al.

[11] Patent Number: 4,541,078
[45] Date of Patent: Sep. 10, 1985

[54] MEMORY USING MULTIPLEXED ROW AND COLUMN ADDRESS LINES

[75] Inventors: Austin C. Dumbri, Easton; Frank J. Procyk, Center Valley, both of Pa.

[73] Assignee: AT&T Bell Laboratories, Murray Hill, N.J.

[21] Appl. No.: 452,155

[22] Filed: Dec. 22, 1982

[51] Int. Cl.³ .............................................. G11C 11/40
[52] U.S. Cl. .................................... 365/230; 365/189
[58] Field of Search ........................ 365/230, 182, 189

[56] References Cited

U.S. PATENT DOCUMENTS

| | | | |
|---|---|---|---|
| 3,760,384 | 9/1973 | Krolikowski et al. | 365/230 |
| 3,806,880 | 4/1974 | Spence | 307/304 |
| 4,050,061 | 9/1977 | Kitagawa | 365/230 |
| 4,200,917 | 4/1980 | Moench | 365/208 |
| 4,275,312 | 6/1981 | Saitou et al. | 365/230 |
| 4,394,753 | 7/1983 | Penzel | 365/236 |

*Primary Examiner*—Terrell W. Fears
*Attorney, Agent, or Firm*—James H. Fox

[57] ABSTRACT

A memory of rows and columns of memory cells uses a multiplexed input address buffer having output row-column address lines which are coupled to a multiplexer and to column decoders. The multiplexer is coupled to row address decoders and serves to selectively couple the address lines to the row decoders. The address lines typically first carry row address information and then column address information. The use of a common portion of the address lines to couple the address buffer to the column decoders and multiplexer tends to reduce the overall size of the memory and thereby increases yield and reduces cost.

11 Claims, 4 Drawing Figures

ROW DECODER 18

MULTIPLEXER 20

COLUMN DECODER 16

MEMORY USING MULTIPLEXED ROW AND COLUMN ADDRESS LINES

FIELD OF THE INVENTION

This invention relates to memories, and in particular, to random access memories which use multiplexed input address lines.

BACKGROUND OF THE INVENTION

Many of today's large capacity semiconductor random access memories use multiplexed input address lines in order to limit the number of external pins on the package and to make same compatible with available memories which have smaller capacity. These large capacity memories typically use several sub-arrays which have row and column decoders that must be coupled to the output address lines of an input address buffer. The silicon area needed to connect up the row and column decoders to the input address buffer increases the overall size of the memory chip and accordingly decreases yield and increases cost.

It is desirable to be able to reduce row and column address lines such that the size of the memory chip and the cost are reduced.

SUMMARY OF THE INVENTION

The present invention is directed to a memory of rows and columns of memory cells with row decoders coupled to the rows and column decoders coupled to the columns. Row address lines, which couple to inputs of the row decoders, are coupled to outputs of a multiplexer which has inputs coupled to address lines that are also coupled to inputs of the column decoders. Portions of the address lines, which may also be denoted as row-column address lines, are shared between some of the column decoders and the multiplexer. The multiplexer is designed to selectively couple the row-column address lines to the row decoders when row address information is on the row-column address lines and to decouple same when column address information is on the row-column address lines. With column address information on the row-column address lines, the column decoders are activated.

The use of common portions of the row-column address lines to provide both row and column address information helps reduce the overall size of the memory and accordingly tends to increase yield and decrease cost.

These and other features and advantages of the invention are better understood from a consideration of the following description taken in conjunction with the accompanying drawing.

DETAILED DESCRIPTION

Figure 1:
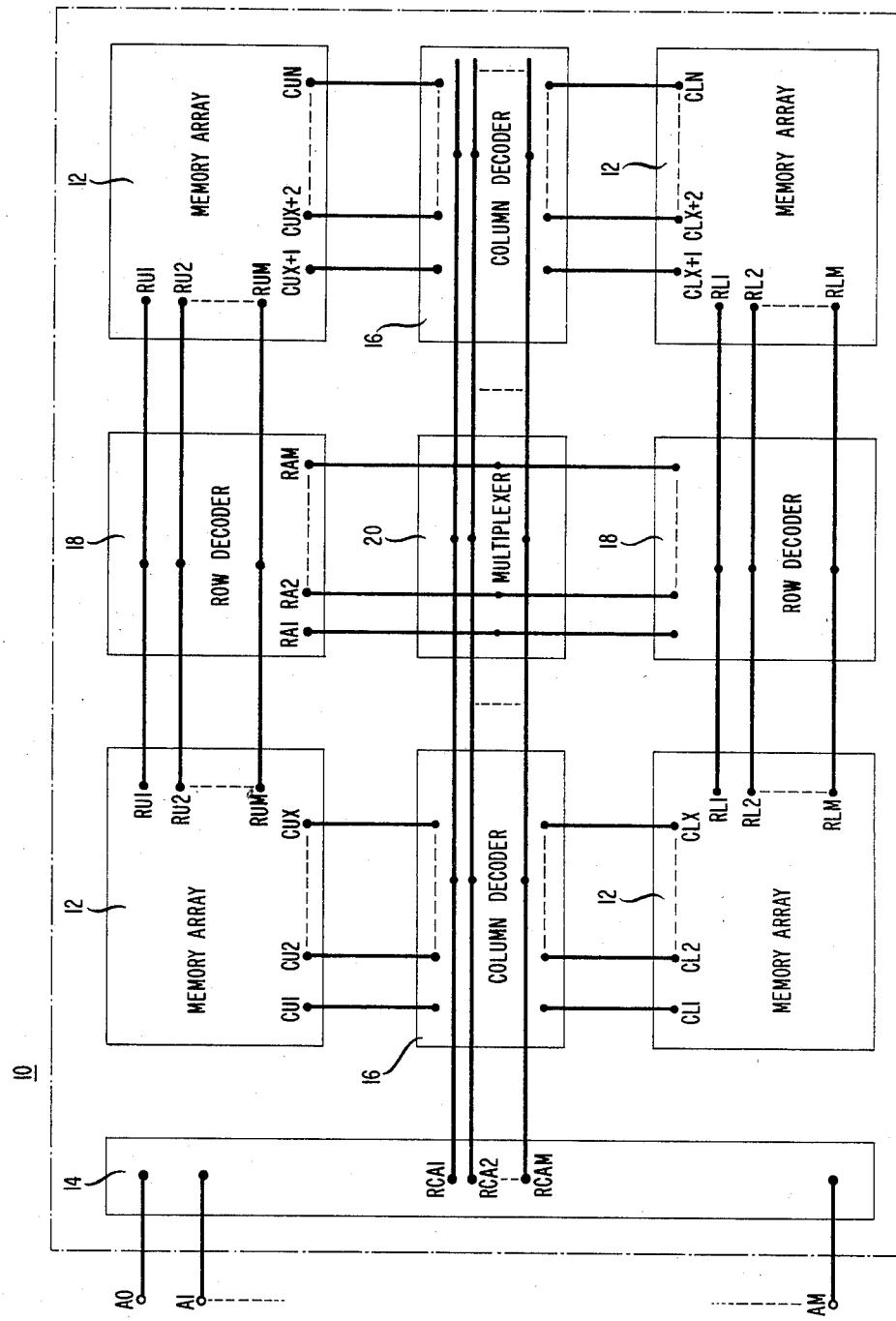
FIG. 1 illustrates in simplified block schematic form portions of a memory in accordance with the invention.

Referring now to FIG. 1, there is illustrated a portion of a memory 10 having four quadrants of memory arrays 12, an address buffer 14, a two-portion column decoder 16, a two-portion row decoder 18, and a multiplexer 20. Column decoder 16 is the subject of a patent application, designated as Ser. No. 452,156, filed Dec. 22, 1982 (A. C. Dumbri-F. J. Procyk Case 7-9) which has a common assignee and is being filed concurrently with this application.

Externally supplied row and column address signals are sequentially applied to input terminals A0, A1 ... AM of address buffer 14. The output lines of address buffer 14, row-column address lines (conductors) RCA1, RCA2 ... RCAM, which also includes the complementary row-column address lines RCA1C, RCA2C ... RCAMC (not illustrated), are coupled to both portions of column decoder 16 and to multiplexer 20. Row address lines RA1, RA2 ... RAM, which also include the complementary row address lines RA1C, RA2C ... RAMC (not illustrated), couple multiplexer 20 to both portions of row decoder 18. The portions of RCA1, RCA2 ... RCAM between address buffer 14 and multiplexer 20 serve the dual purpose of supplying row address and column address information. The use of just one set of such lines helps reduce the oversize of the memory chip and thereby increases yield and reduces cost.

The left portion of column decoder 16 (the portion left of multiplexer 20) is coupled through lines CU1, CU2 ... CUX to columns of the upper-left memory array 12 and is coupled through lines CL1, CL2 ... CLX to columns of the lower-left memory array 12. The right portion of column decoder 16 (the portion right of multiplexer 20) is coupled through lines CUX+1, CUX+2 ... CUN to columns of the upper-right memory array 12 and is coupled through lines CLX+1, CLX+2 ... CLN to columns of the lower-right memory array 12. The upper portion of row decoder 18 is coupled through lines RU1, RU2 ... RUM to rows of both upper memory arrays 12. The lower portion of row decoder 18 is coupled through lines RL1, RL2 ... RLM to rows of both lower memory arrays 12. Address buffer 14 output lines RCA1, RCA2 ... RCAM are coupled to both portions of column decoder 16 and to multiplexer 20. Lines RA1, RA2 ... RAM couple both portions of row decoder 18 to multiplexer 20. The two upper portions of the memory array from one sub-memory array, and the two lower portions of the memory array form a second sub-memory array.

The operation of the memory is such that row address information is first applied to input terminals A0, A1 ... AM, and the output signals of address buffer 14 appear on RCA1, RCA2 ... RCAM. At this time, column decoder circuits 16 are all disabled, and multiplexer 20 is activated such that the row address signals on RCA1, RCA2 ... RCAM are transferred through multiplexer 20 to row address lines RA1, RA2 ... RAM, respectively. After all row decoders decode the received row address signals, and selection of the appropriate row of a memory array is made, the multiplexer 20 decouples RA1, RA2 ... RAM from RCA1, RCA2 ... RCAM, row address information applied to input terminals A0, A1 ... AM is terminated, and column address information is applied to input terminals A0, A1 ... AM. Subsequently, the column decoders are activated, and the column information is supplied to the memory arrays in an analogous fashion.

Figure 2:
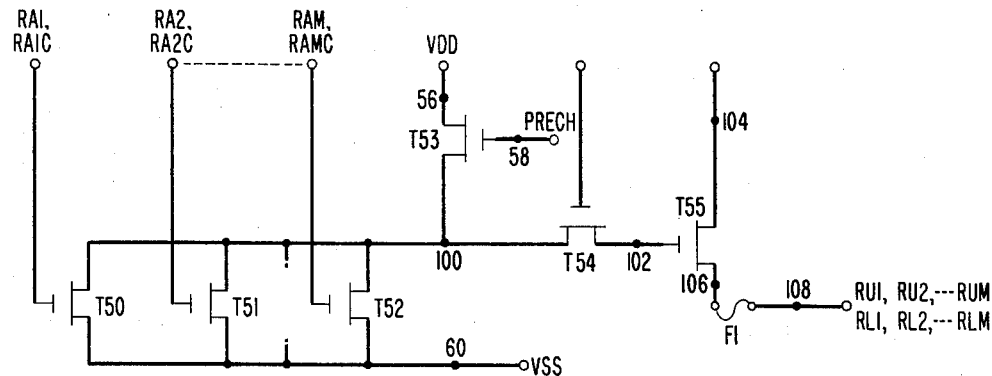
FIG. 2 illustrates in circuit schematic form a row decoder which can be used with the memory of FIG. 1.

As is well known, each of the row decoder portions and the column decoder portions typically comprise a plurality of row decoder circuits and column decoder circuits, respectively, one for each row or column of the memory being served. In FIG. 2, there is illustrated a suitable individual row decoder circuit and in FIG. 3 a suitable individual column decoder circuit and in FIG. 4 a suitable multiplier circuit, which are exemplary of the circuits that can be used.

Turning now to FIG. 2, the individual row is of a kind well known in the art, and decoder 18 basically comprises a parallel group of MOS address decoding transistors T50, T51, and T52 (one for each binary digit of the address to be decoded), a precharge transistor T53, an interrupt (buffer) transistor T54, a driver transistor T55, and a fusible link F1 which is optional but useful for eliminating this circuit if redundancy is being provided in the memory. For simplicity, only three of the address decoding transistors T50, T51, and T52 are shown. Each of the drains of T50, T51, T52, and T54, and the source of T53, are coupled to a common node 100. The drain of T53 is coupled to a node 56 and maintained at the potential voltage level VDD. The source of T54 is coupled to the gate of T55 and to a node 102. The sources of T50, T51, and T52 are all coupled to a node 60 and maintained at the potential voltage level VSS which is typically, but not necessarily, ground potential. Interrupt transistor T54 serves as a transmission gate permitting selective isolation of the high capacitance on node 100 from the gate of driver transistor T55. The on-off state of transistor 54 is controlled by an appropriate fixed potential level or by a control pulse applied to its gate. As is well known to workers in the art, a particular decoder of the kind shown is selected when all of the inputs to the decoding transistors T50, T51, and T52, supplied from addressing circuits (not illustrated), are low, in which case node 100 is maintained high, and the associated driver transistor T55, whose gate is controlled by the voltage on node 102 is kept on, permitting a high drive voltage provided on the drain (terminal 104) of transistor T55 to be applied to the source of T55 (node 106) and through F1 to nodes RU1, RU2 ... RUM, RL1, RL2 ... RLM of the standard memory arrays. If the particular decoder is to be deselected (not selected), one or more of the inputs applied to it from the addressing circuits will be high, in which case the voltage on node 100 drops to approximately VSS, and transistor T55 turns off whereby no drive voltage reaches node 106. As previously mentioned, if redundancy is desired, a fusible link F1 is typically included in each of the standard decoders, and this link is left undisturbed if the particular decoder is to be retained in the standard array, as is the case if prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation. A spare row decoder (not illustrated) is substituted for the defective row decoder by techniques well known in the art.

In a preferred embodiment, the link opened is a layer of silicide on a layer of polysilicon doped to be high conductive, about 5000 Angstroms thick, about 10 microns long, and about 2 microns wide, and it is opened by being vaporized by incident high energy pulses provided by a 1.06 or 0.53 micron YAG laser. Advantageously, this is done after the memory chip fabrication is essentially complete by which time the combined polysilicon-silicide layer will have been covered with a phosphorus doped glass which, however, is transparent to the radiation.

Figure 3:
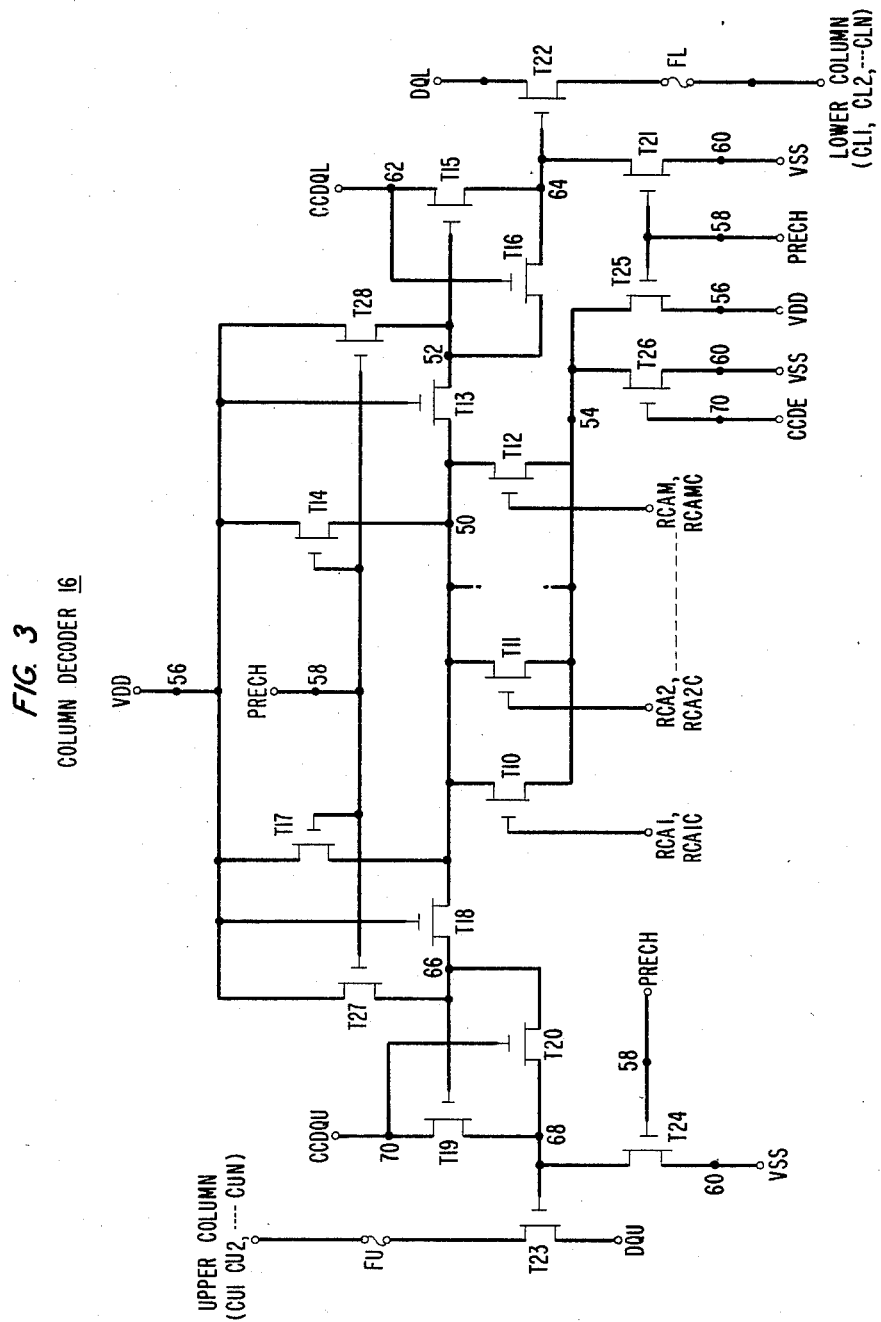
FIG. 3 illustrates in circuit schematic form a column decoder which can be used with the memory of FIG. 1.

Turning now to FIG. 3, the individual column decoder 16 includes a basic section. This basic section comprises a parallel group of MOS address decoding transistors, of which only three are shown, T10, T11, and T12, precharge transistors T14, T17, T21, T24, T27, and T28, interrupt transistors T13 and T18, driver transistors T15 and T19, output column transistors T22 and T23, quieting transistors T16 and T20, and fusible links FU and FL which are optional. Transistors T25 and T26 are not part of the basic section but are used to activate or deactivate column decoder 16, as is described hereinbelow and in the patent application, designated as Ser. No. 452,156, filed Dec. 22, 1982 (A. C. Dumbri-F. J. Procyk Case 7-9).

Each of the drains of T10, T11, T12, T13, and T18 and the sources of T14 and T17, are coupled to a common node 50. The drains of T14, T17, T25, T27, and T28, and the gates of T13 and T18, are coupled to a node 56 which is maintained at the potential of the voltage level VDD. The source of T13 is coupled to the gate of T15, to the source of T28, to the source of T16, and to a node 52. The source of T18 is coupled to the sources of T20 and T27, and to the gate of T19, and to a node 66. The sources of T10, T11, and T12 are all coupled to a node 54 and to the source of T25 and to the drain of T26. The sources of T21, T24, and T26 are coupled to a node 60 and maintained at the voltage level VSS, which is typically, but not necessarily, ground potential. The gates of T13 and T18 are illustrated coupled to VDD, but same could be coupled to a voltage pulse source (not illustrated) which would selectively turn on and off the transistors. The gate of T16 is coupled to the drain of T15, to a node 62, and to a source of voltage pulse CCDQL. The source of T15 is coupled to the drain of T21, the gate of T22, the drain of T16, and to a node 64. The drain of T22 is coupled to a node DQL, and the source of T22 is coupled through FL to one of lower column lines CL1, CL2 . . . CLX, CLX+1, CLX+2 . . . CLN. The source of T20 is coupled to the source of T27, the gate of T19, the source of T18, and to a node 66. The gate of T20 is coupled to the drain of T19, to a node 70, and to a source of voltage pulses CCDQU. The source of T19 is coupled to the gate of T23, to the drain of T24, to the drain of T20, and to a node 68. The source of T23 is coupled through FU to one of upper column lines CU1, CU2 . . . CUX, CUX+1, CUX+2 . . . CUN, and the drain of T23 is coupled to a node DQU. The gates of T14, T17, T21, T24, T25, T27, and T28 are coupled to a node 58 and to a source of voltage pulses PRECH. The gate of T26 is coupled to node 70 and to a voltage pulse source CCDE. Interrupt transistors T13 and T18 serve as transmission gates permitting selective isolation of the high capacitance on node 50 from nodes 52 and 66.

Column decoder 16 is essentially activated by having CCDE high and PRECH low. This causes terminal 54 to be low, at or near VSS in potential. With CCDE high and PRECH low, column decoder 16 is selected when all of the input signals RCA0, RCA0C, RCA1, RCA1C, RCAM, RCAMC to the decoding transistors T10, T11, and T12, supplied from address buffer 14, are low. With these conditions, node 50 is maintained high, and the associated driver transistors T15 and T19, whose gates are controlled by the voltage on nodes 52 and 66, respectively, are kept on, permitting a high drive voltage provided by pulse source CCDQL at node 62 (the drain of transistor T15) or by pulse source CCDQU at node 70 (the drain of T19) to be applied to output node 64 or 68 and thereby turn on T22 or T23. During the time column address information is being received by column decoder 16, CCDQU or CCDQL is high and the other is low. If a selected memory cell is in the upper section of the memory array, then CCDQU is high and CCDQL is low. Conversely, if a selected memory cell is in the lower section of the memory array, then CCDQL is high and CCDQU is low. If the particular decoder is to be deselected (not selected) by the input column address information, one or more of the inputs applied to it from the addressing circuits is high. In such case the voltage on node 50 drops to approximately VSS, and transistors T15 and T19 turn off whereby no drive voltage reaches nodes 64 and 68. As previously mentioned, fusible links FU and FL are typically included and are left undisturbed if the particular decoder and its associated cells are to be retained in the standard array, as is the case if prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation. In such case, a spare column decoder (not illustrated) is substituted by techniques well known in the art.

As is discussed above, column decoder 16, in order to be deselected by column address information, must be activated by having T26 biased on and T25 biased off. At the beginning of a cycle of operation of memory 10, the precharge signal PRECH applied to terminal 58 is high, and the CCDE signal applied to the gate of T26 is low. This inhibits address information appearing on the gates of T10, T11, and T12 to affect nodes 50 and 54 by causing nodes 50 and 54 to be at a potential at or close to VDD. This would correspond to a selected decoder but for the fact that during the time PRECH is high (the time during which row address information appears on row-column address lines RCA1, RCA2 ... RCAM), CCDQU and CCDQL are both held low. This keeps T22 and T23 biased off. This leaves terminal 50 at or near VDD in potential. As soon as the column decoder 16 is activated by CCDE going high and PRECH going low, column address information can be applied to column decoder 16, and there is no need to waste time or energy first charging node 50 to a potential level at or near VDD since it is already at said potential. It is necessary to discharge node 54 from at or near VDD to VSS before column decoder 16 is fully activated. The time necessary to discharge node 54 is small compared to the time it would take to charge node 50 to VDD if same was not left at VDD by T25.

T16 and T20 serve to help maintain nodes 64 and 68, respectively, at or close to VSS when nodes 52 and 66, respectively, are nominally at VSS. During read or write operations of the memory, signals (not illustrated) on the column lines may cause capacitive coupling to terminals 64 and 68, which can cause the potential thereof to vary from desired levels. T16 and T20 serve to maintain the desired levels on these nodes.

Figure 4:
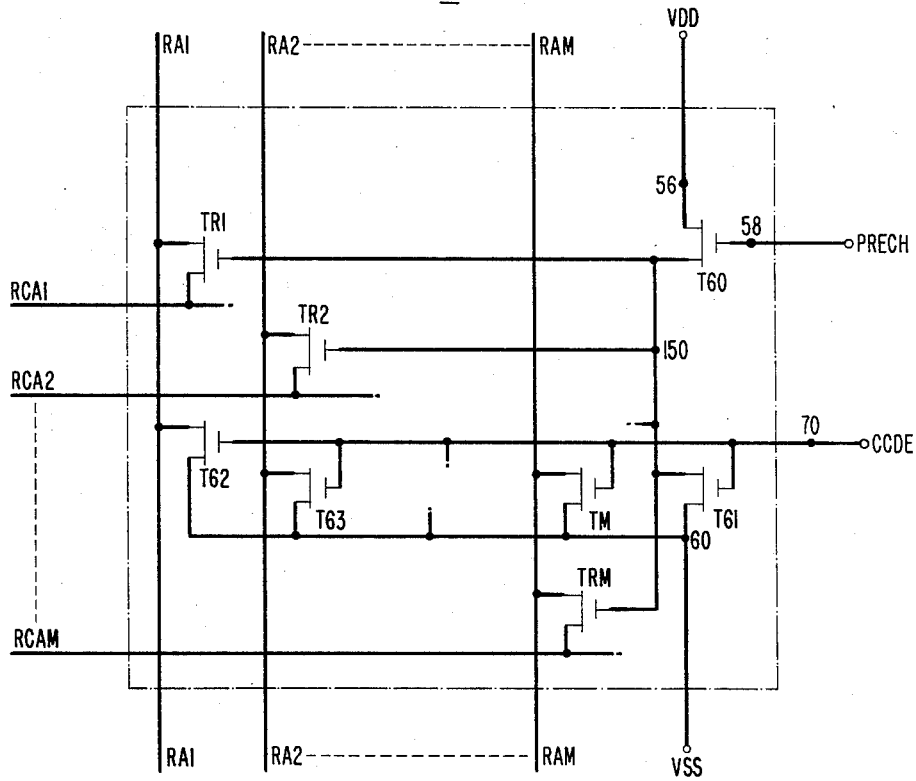
FIG. 4 illustrates in circuit schematic form a multiplexer which can be used with the memory of FIG. 1.

Now turning to FIG. 4, multiplexer 20 comprises essentially row-column address coupling-decoupling transistors TR1, TR2 ... TRM, with each of said transistors having the drain coupled to one of the row-column address lines RCA1, RCA2 ... RCAM and the source coupled to one of the row address lines RA1, RA2 ... RAM. The gates of all of TR1, TR2 ... TRM are all coupled to the drain of a transistor T60, to the drain of a transistor T61, and to a node 150. The drain of T60 is coupled to node 56 and maintained at the potential voltage level VDD. The source of T61 is coupled to a node 60 and maintained at the potential voltage level VSS. A separate transistor T62, T63 ... TM is coupled by the drain to each one of RA1, RA2 ... RAM and by the source to node 60 and to VSS. The gates of T61, T62, T63 ... TM are all coupled together to a node 70 and to a voltage pulse source CCDE. The gate of T60 is coupled to a node 58 and to a voltage pulse source PRECH.

At the beginning of a cycle of memory 10, CCDE is low and PRECH is high. This turns on T60 and turns off T61, T62, T63 ... TM. Consequently, node 150 is high, and TR1, TR2 ... TRM are turned on. Address input information applied to input terminals A0, A1 ... AM results in row addresses on RCA1, RCA2 ... RCAM. The row addresses couple through TR1, TR2 ... TRM, respectively, and reach the gates of the row address decoder transistors of row decoder 18. After the row address information has been decoded by the row address decoder 18, PRECH goes low and CCDE goes high. This turns on T61 and T62, T63 ... TM. Node 150 assumes a low potential, and consequently TR1, TR2 ... TRM are all biased off. In addition, each of RA1, RA2 ... RAM is low in potential. These conditions essentially decouple row decoder 18 from lines RCA1, RCA2 ... RCAM. Column address information is now applied to input terminals A0, A1 ... AM, and column address information now reaches the column decoder 16 which becomes activated at this time.

A 256K DRAM has been fabricated on a single silicon chip and tested and found to be functional. It uses multiplexed row-column address lines, a multiplexer, and row and column decoders as are illustrated and described herein. The upper and lower memory arrays each contain 128K of memory.

The embodiments described herein are intended to be illustrative of the general principles of the present invention. Various modifications are possible consistent with the spirit of the invention. For example, different types of row and column decoders and multiplexers could be used. Column decoders may be common to multiple pairs of columns. Still further, T25 and T26 of column decoder 16 can be eliminated, and node 54 could be coupled directly to VSS. The resulting column decoder is still functional; however, node 50 may become discharged to VSS during the time row address information is coupled to the gates of T10, T11, T12. Node 50 would then have to be again set to a level at or near VDD before column address information can be applied to the gates of T10, T11, and T12. Still further, the row and column decoders need not have fusible links and accordingly need not be replaceable if same fails. Still further, bipolar or complementary MOS transistor or other types of switches could be used in the decoders and/or the multiplexer.

What is claimed is:

1. A memory array of rows and columns of memory cells with row decoders coupled to the rows and column decoders coupled to the columns comprising:
   address lines coupled to the column decoders;
   a multiplexer coupled to the address lines and to the row decoders for selectively coupling the address lines to the row decoders; and portions of the address lines which are coupled to the multiplexer also being coupled to the column decoders, wherein:

the memory array comprises an upper section and a lower section;

the row decoders have an upper portion and a lower portion;

the upper section of the memory array being separated essentially at the center into left and right-hand portions by the upper portion of the row decoders;

the lower section of the memory array being separated essentially at the center into left and right-hand portions by the lower portion of the row decoders;

the column decoders having left and right-hand portions;

the left-hand portion of the column decoders being located between the upper and lower left-hand portions of the memory array;

the right-hand portion of the column decoders being located between the upper and lower right-hand portions of the memory array; and the common portion of the address lines running between the upper and lower left-hand portions of the memory array, wherein:

the multiplexer comprises a plurality of first switching devices which each have a control terminal and first and second output terminals;

the control terminals of the switching devices all being coupled together to means for turning on or turning off all of the switching devices; and the first output terminal of each switching device being coupled to a separate one of the address lines and the second output terminal of each switching device being coupled through a separate row address line to a separate one of input terminals of the row decoders.

2. The memory of claim 1 wherein:

the means for turning on or off the plurality of first switching devices comprises second and third switching devices which each have a control terminal and first and second output terminals; and the second output terminal of the second switching device being coupled to the first output terminal of the third switching device and to the control terminals of the plurality of first switching devices.

3. The memory of claim 2 wherein:

the first output terminal of the second switching device is connectable to a source of potential having a polarity and potential level which, if applied to the control terminals of the plurality of first switching devices, turns same on; and the second output terminal of the third switching device is connectable to a source of potential having a polarity and potential level which, if applied to the control terminals of the plurality of first switching devices, turns same off.

4. The memory of claim 3 wherein:

each of the row decoders and each of the column decoders comprise a separate plurality of decoder switching devices each having a control terminal which serves an input terminal of the decoder and each having first and second output terminals;

separate means coupled to the first output terminals of each of the separate plurality of decoder switching devices for selectively setting the potential thereof to a first level;

the second output terminals of the plurality of row decoder switching devices connectable to a potential source having a second potential level; and the second output terminals of the column decoder switching devices being connectable to first means for selectively coupling same to a potential source having a potential of the first level and to second means for selectively coupling same to a potential source having a potential of the second level.

5. The memory of claim 4 wherein all portions thereof are formed on a single chip.

6. The memory of claim 1 wherein the column decoders include means for disabling same when the multiplexer couples the address lines to the row decoders.

7. The memory of claim 2 wherein the column decoders include means for disabling same when the multiplexer couples the address lines to the row decoders.

8. The memory of claim 3 wherein the column decoders include means for disabling same when the multiplexer couples the address lines to the row decoders.

9. The memory of claim 4 wherein the column decoders include means for disabling same when the multiplexer couples the address lines to the row decoders.

10. The memory of claim 5 wherein the column decoders include means for disabling same when the multiplexer couples the address lines to the row decoders.

11. A memory array of rows and columns of memory cells with row decoders coupled to the rows and column decoders coupled to the columns comprising:

address lines coupled to the column decoders;

a multiplexer coupled to the address lines and to the row decoders for selectively coupling the address lines to the row decoders;

portions of the address lines which are coupled to the multiplexer also being coupled to the column decoders;

the memory array comprises an upper section and a lower section;

the row decoders have an upper portion and a lower portion;

the upper section of the memory array being separated essentially at the center into left and right-hand portions by the upper portion of the row decoders;

the lower section of the memory array being separated essentially at the center into left and right-hand portions by the lower portion of the row decoders;

the column decoders having left and right-hand portions;

the left-hand portion of the column decoders being located between the upper and lower left-hand portions of the memory array;

the right-hand portion of the column decoders being located between the upper and lower right-hand portions of the memory array;

the common portion of the address lines running between the upper and lower left-hand portions of the memory array;

the multiplexer comprises a plurality of first switching devices which each have a control terminal and first and second output terminals;

the control terminals of the switching devices all being coupled together to means for turning on or turning off all of the switching devices; and the first output terminal of each switching device being coupled to a separate one of the address lines and the second output terminal of each switching device being coupled through a separate row address line to a separate one of input terminals of the row decoders.

* * * * *